US005608462A

United States Patent [19]
Maas et al.

[11] Patent Number: 5,608,462
[45] Date of Patent: Mar. 4, 1997

[54] SYNCHRONIZING ARRANGEMENT INCLUDING A GATE CIRCUIT AND A WINDOW CIRCUIT FOR DETERMINING THE OCCURRENCE OF OUTPUT PULSES

[75] Inventors: Johannes A. A. G. Maas; Johannes B. Meertens, both of Eindhoven, Netherlands

[73] Assignee: U.S. Philips Corporation, New York, N.Y.

[21] Appl. No.: 485,895

[22] Filed: Jun. 7, 1995

[30] Foreign Application Priority Data

Jun. 10, 1994 [EP] European Pat. Off. ............... 94201661

[51] Int. Cl.⁶ ........................................................ H04N 5/10
[52] U.S. Cl. ............................................ 348/531; 327/141
[58] Field of Search .................................... 348/530, 531, 348/536, 540, 543, 544; 327/141, 142, 144, 147, 151, 156; H04N 5/05, 5/08, 5/10

[56] References Cited

U.S. PATENT DOCUMENTS 4,843,469  6/1989  Boyce .................................... 348/546
4,974,081  1/1990  Yokogawa .............................. 348/542
5,034,815  7/1991  Shibayama ............................ 358/153
5,272,532  12/1993  Alba ..................................... 348/536
5,418,573  5/1995  Basile et al. .......................... 348/537

Primary Examiner—John K. Peng
Assistant Examiner—Michael H. Lee
Attorney, Agent, or Firm—Edward W. Goodman

[57] ABSTRACT

A synchronizing arrangement includes a window circuit (WINC1,WINC2) for generating a periodic window signal (LW,RW), and a gate circuit (GC) for supplying a periodic gating pulse (Hp). The gating pulse (Hp) is related to a presented synchronizing pulse (Hs) if the presented synchronizing pulse (Hs) occurs during the window signal (LW,RW). The gate circuit (GC) generates the gating pulse (Hp) related to a leading edge of the window signal (LW) if the presented synchronizing pulse (Hs) occurs before the start of the window signal (LW,RW), and the gate circuit (GC) generates the gating pulse (Hp) related to a trailing edge of the window signal (RW) if the presented synchronizing pulse (Hs) occurs after the end of the window signal (LW,RW).

23 Claims, 6 Drawing Sheets

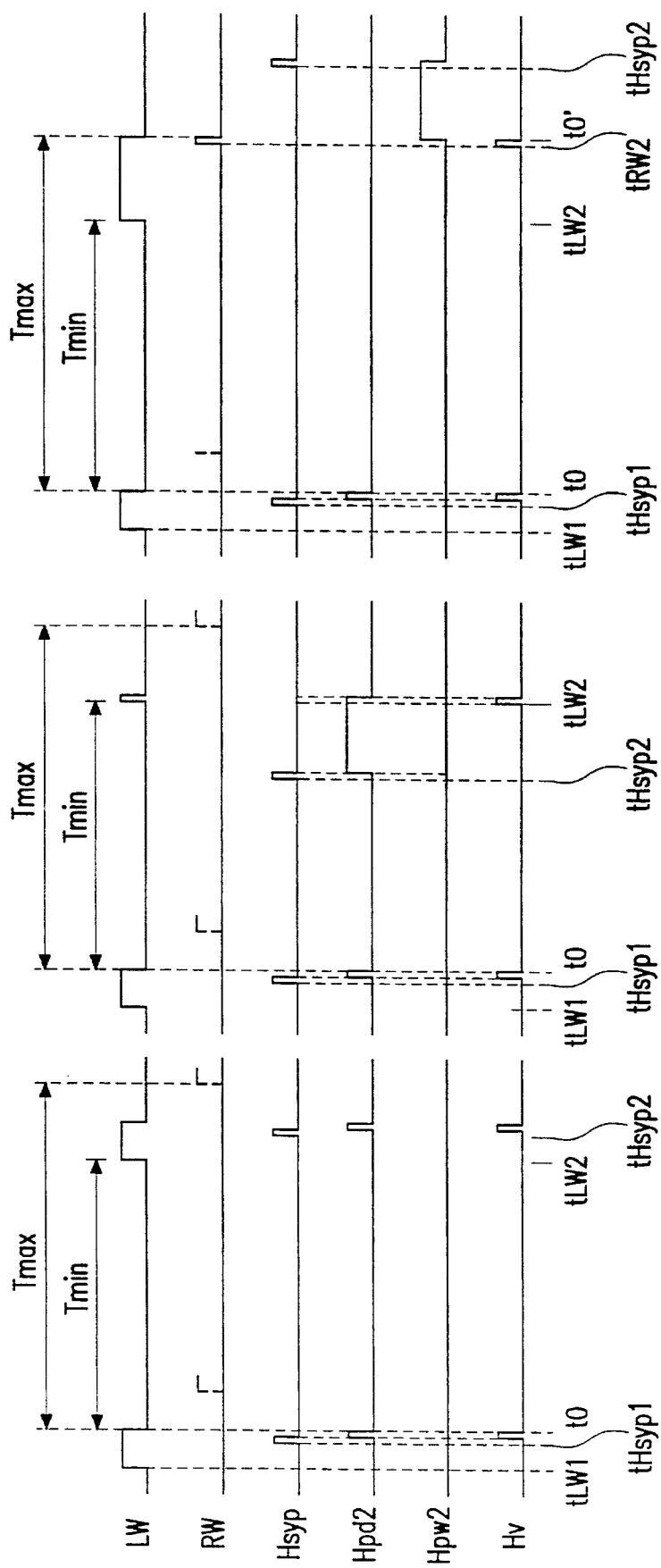

SYNCHRONIZING ARRANGEMENT INCLUDING A GATE CIRCUIT AND A WINDOW CIRCUIT FOR DETERMINING THE OCCURRENCE OF OUTPUT PULSES

The invention relates to a synchronizing arrangement comprising:
- a window circuit for generating a repetitive window signal, and
- a gate circuit for supplying a repetitive gating pulse related to a presented synchronizing pulse if the presented synchronizing pulse occurs during the window signal, the gating pulse being related to the window signal if the presented synchronizing pulse does not occur during the window signal.

The invention also relates to synchronizing methods, and to a picture display device including the above-mentioned synchronizing arrangement.

DESCRIPTION OF THE RELATED ART

A synchronizing arrangement of this type is known from U.S. Pat. No. 5,034,815. Vertical and horizontal synchronizing pulses are derived from a composite video signal, while the horizontal synchronizing pulses are separated from the composite video signal via a parallel path, which horizontal synchronizing pulses generate the window signal via a rapid phase-locked loop (PLL) which is here referred to as automatic frequency control circuit (AFC).

As long as the horizontal synchronizing pulses occur during the window signal, the time information of the horizontal synchronizing pulses is supplied from the output of the gate circuit. If the horizontal synchronizing pulses do not occur during the window signal, the gate circuit supplies the window signal from its output. In this way, horizontal synchronizing pulses which have been reasonably predicted by the AFC circuit can be substituted for presented horizontal synchronizing pulses which do not occur within an expected time window, for example due to a less satisfactory signal processing in a peripheral apparatus such as a video cassette recorder (VCR) or due to another perturbation of the original signal during transmission. The invention described in U.S. Pat. No. 5,034,815 provides a given extent of protection against an erroneous position of the presented horizontal synchronizing pulses.

However, the time between two consecutive output pulses leaving the gate circuit may vary considerably. A given maximum period between two consecutive output pulses, hence a maximum line period must not be exceeded because this leads to unwanted high voltages and hence to overload of components in the horizontal deflection circuit. Moreover, if a too large deviation of the nominal horizontal line periods, to an either longer or shorter extent, caused by an erroneous position of the output pulse is admitted in perturbed situations, the time required after these situations to correct to a nominal or substantially nominal repetition frequency of the incoming horizontal synchronizing pulses will become longer than is desired so that visible perturbations may occur in the upper pan of the picture. Such a limitation of the instantaneous repetition frequency with respect to the nominal repetition frequency has the same advantage in a vertical deflection circuit or in a synchronizing arrangement for driving another display such as an LCD. Moreover, a too large change of the period of time between two consecutive output pulses in two consecutive periods also results in unwanted high voltages in the horizontal deflection.

Moreover, if the presented horizontal synchronizing pulse occurs during the window signal, the width of the output pulse will be dependent on the position of the horizontal synchronizing pulse with respect to the window signal. If the horizontal synchronizing pulse does not occur during the window signal, the window signal is passed on as an output pulse with a fixed chosen width. This width variation of the output pulses disturbs the operation of a subsequent horizontal deflection phase-locked loop circuit (H-PLL) if this circuit has such a structure that the width of this output pulse is used. The result is a perturbation of the horizontal position of the picture, dependent on the width of said output pulse.

Moreover, in a stable situation, a correct operation of the horizontal synchronizing arrangement requires the position of the leading edge of the window signal to occur after the trailing edge of the horizontal synchronizing pulse. This may be an unwanted limitation of the range within which the gate circuit passes on the horizontal synchronizing pulses to the output.

SUMMARY OF THE INVENTION

It is, inter alia an object of the invention to provide a synchronizing arrangement and a method in which the output pulses occur within predetermined time limits.

To this end a first aspect of the invention provides a synchronizing arrangement comprising a window circuit for generating a repetitive window signal; and a gate circuit for supplying a repetitive gating pulse related to a presented synchronizing pulse if the presented synchronizing pulse occurs during the window signal, while the gating pulse is related to the window signal if the presented synchronizing pulse does not occur during the window signal, characterized in that the gate circuit comprises means for generating the gating pulse related to a leading edge of the window signal if the presented synchronizing pulse occurs before the start of the window signal, and for generating the gating pulse related to a trailing edge of the window signal if the presented synchronizing pulse occurs after the end of the window signal. The time position of the gating pulse occurring at the output of the gate circuit is related to the time position of the leading edge of the window signal if the presented horizontal synchronizing pulse occurs before the start of the window signal, or the time position of the gating pulse is related to the time position of the trailing edge of the window signal if the presented horizontal synchronizing pulse occurs after the end of the window signal. This provides the freedom of choice of the position of the leading edge of the window with respect to the position of the horizontal synchronizing pulse and the desired width of the gating pulse. A pulse is related to one of the edges of the window signal if this pulse occurs on the same time instant as the relevant window edge or if this pulse occurs on a time instant shifted with a certain delay with respect to the time instant on which the relevant window edge occurs. The certain delay may be caused by circuits needed to process the signals, or computing time of a microcomputer.

A further embodiment of the synchronizing arrangement is characterized in that the window circuit comprises means for generating a reference pulse related to the presented synchronizing pulse if a pulse related to the presented synchronizing pulse occurs during the window signal, and for generating a reference pulse related to the leading edge or the trailing edge of the window signal if the presented synchronizing pulse does not occur during the window signal, said reference pulse providing a time reference for determining the subsequent window signal. The reference pulse may be a reproduction of the output pulse of the gate circuit.

A further embodiment of the synchronizing arrangement is characterized in that the window circuit comprises means for generating the reference pulse related to the leading edge of the window signal if the pulse related to the presented synchronizing pulse occurs before the start of the window signal, and for generating the reference pulse related to the trailing edge of the window signal if the pulse related to the presented synchronizing pulse occurs after the end of the window signal. This embodiment has the advantage that the reference pulse is thus as close as possible to the presented synchronizing pulse but not outside the window signal.

A further embodiment of the synchronizing arrangement is characterized in that the window circuit comprises means for generating the reference pulse at such an instant that the length of the time interval formed together with a preceding reference pulse is as close as possible to the period of time between two consecutive pulses being related to the presented synchronizing pulse and which consecutive pulses correspond with the reference pulses, said instant being always within a window defined by the leading edge of the window signal and the trailing edge of the window signal. This embodiment has the advantage that the reference pulse occurs as close as possible to the presented synchronizing pulse if this pulse occurs during the window signal, or the reference pulse occurs at one of the edges of the window signal in such a way that, as compared with the previous reference pulse, a period of time is produced which is as close as possible to the period of time between the two consecutive pulses related to the synchronizing pulse.

A further embodiment of the synchronizing arrangement is characterized in that the window circuit comprises edge-generating means for generating the leading edge and the trailing edge of the window signal in relation to the previous output pulse of the gate circuit, while another embodiment of the synchronizing arrangement is characterized in that the window circuit comprises edge-generating means for generating the leading edge and the trailing edge of the window signal in relation to the reference pulse. An advantage of both embodiments is that they provide the possibility of fixing, within given limits, the minimum time between the current output pulse or reference pulse and the leading edge of the subsequent window signal, and the maximum time between the current output pulse or reference pulse and the trailing edge of the subsequent window signal.

A still further embodiment of the synchronizing arrangement is characterized in that the window circuit and the gate circuit are coupled to receive the presented synchronizing pulse and to apply the gating pulse to a phase-locked loop circuit, or an input terminal of the window circuit and the gate circuit is coupled to an output terminal of the phase-locked loop circuit, and in that an input terminal of the phase-locked loop circuit is coupled to receive the presented synchronizing pulse, the synchronizing arrangement further comprising means for generating a clock signal related to an oscillator of the phase-locked loop circuit, the edge-generating means being adapted to count a given number of pulses from the oscillator of the phase-locked loop circuit so as to determine the period of time from the current gating pulse to the leading edge and the trailing edge of a future window signal, while yet another embodiment is characterized in that the window circuit and the gate circuit are coupled to receive the presented synchronizing pulse and to apply the gating pulse to a phase-locked loop circuit, or an input terminal of the window circuit and the gate circuit is coupled to an output terminal of the phase-locked loop circuit, and in that an input terminal of the phase-locked loop circuit is coupled to receive the presented synchronizing pulse, the synchronizing arrangement further comprising means for generating a clock signal related to an oscillator of the phase-locked loop circuit, the edge-generating means being adapted to count a given number of pulses from the oscillator of the phase-locked loop circuit so as to determine the period of time from the current reference pulse to the leading edge and the trailing edge of a future window signal. These two embodiments have the advantage that two consecutive periods of time between three consecutive output pulses of the gate circuit can never change by more than the width of the window signal so that the deflection circuit does not receive too rapid changes of periods and the components will not be overloaded.

A still further embodiment of the synchronizing arrangement is characterized in that the window circuit further comprises a separate oscillator for generating a clock signal, the edge-generating means being adapted to count a given number of pulses from the separate oscillator so as to determine the period of time from the current gating pulse to the leading edge and the trailing edge of a future window signal, while yet another embodiment is characterized in that the window circuit further comprises a separate oscillator for generating a clock signal, the edge-generating means being adapted to count a given number of pulses from the separate oscillator so as to determine the period of time from the current reference pulse to the leading edge and the trailing edge of a future window signal. These two embodiments have the advantage that the output signal of the window circuit has more or less accurately limited minimum and maximum periods of time between consecutive output pulses, dependent on the chosen stability of the separate oscillator. It is, inter alia achieved thereby that a horizontal oscillator forming part of the horizontal PLL cannot deviate unnecessarily far from the nominal horizontal frequency and that the components in the horizontal deflection circuit subsequent to the horizontal synchronizing arrangement cannot be overloaded. This construction provides the additional advantage that the leading edge and the trailing edge of the window signal can be generated non-symmetrically with respect to the nominal position of the subsequent output pulse. This is important for TV apparatuses in which a plurality of TV systems operating at different horizontal frequencies (for example, PAL, NTSC, Muse) must be processed without adaptations of the circuit.

A further additional advantage of a high accuracy is that the tolerance of components need not be taken into account when dimensioning the PLL so as to fix a minimum or maximum line period, so that the real maximum line period is much smaller than the maximum allowed period. Consequently, the rate at which frequency and phase jumps can be corrected (especially for input pulses having a lower repetition frequency than the nominal frequency) is not unnecessarily limited.

A further embodiment of the synchronizing arrangement is characterized in that the gate circuit comprises means for giving the gating pulse a desired width. This embodiment has the advantage that phase-locked loop circuits which use the width of the pulse presented thereto can operate in an undisturbed manner.

A synchronizing method, comprising the steps of generating a repetitive window signal, and generating a repetitive gating pulse related to a presented synchronizing pulse if the presented synchronizing pulse occurs during the window signal, while the gating pulse is related to the window signal if the presented synchronizing pulse does not occur during the window signal, characterized in that the gating pulse is related to a leading edge of the window signal if the presented synchronizing pulse occurs before the start of the window signal, and for generating the gating pulse related to a trailing edge of the window signal if the presented synchronizing pulse occurs after the end of the window signal, comprising the steps of generating a repetitive window signal, and generating a repetitive gating pulse related to a presented synchronizing pulse if the presented synchronizing pulse occurs during the window signal, while the gating pulse is related to the window signal if the presented synchronizing pulse does not occur during the window signal, characterized in that the gating pulse is related to a leading edge of the window signal if the presented synchronizing pulse occurs before the start of the window signal, and for generating the gating pulse related to a trailing edge of the window signal if the presented synchronizing pulse occurs after the end of the window signal, provides a second aspect of the invention.

A picture display device, comprising an input terminal for receiving picture information, means for separating the horizontal synchronizing pulses, a synchronizing arrangement for controlling a horizontal addressing of the picture display device, and a display screen, the synchronizing arrangement comprising a window circuit for generating a repetitive window signal, and a gate circuit for supplying a repetitive gating pulse related to a presented synchronizing pulse if the presented synchronizing pulse occurs during the window signal, while the gating pulse is related to the window signal if the presented synchronizing pulse does not occur during the window signal, characterized in that the gate circuit comprises means for generating the gating pulse related to a leading edge of the window signal if the presented synchronizing pulse occurs before the start of the window signal, and for generating the gating pulse related to a trailing edge of the window signal if the presented synchronizing pulse occurs after the end of the window signal, provides a third aspect of the invention.

A picture display device, adapted to receive picture information at an input terminal for separating the horizontal synchronizing pulses, for controlling a horizontal addressing and for displaying the picture information on a display screen, the control of the horizontal addressing comprising the steps of generating a repetitive window signal, and generating a repetitive gating pulse related to a presented synchronizing pulse if the presented synchronizing pulse occurs during the window signal, while the gating pulse is related to the window signal if the presented synchronizing pulse does not occur during the window signal, characterized in that the gating pulse is related to a leading edge of the window signal if the presented synchronizing pulse occurs before the start of the window signal, and in that the gating pulse is related to a trailing edge of the window signal if the presented synchronizing pulse occurs after the end of the window signal, provides a fourth aspect of the invention.

A synchronizing arrangement, comprising a window circuit for generating repetitive window instants comprising a window start instant and a window end instant, and a gate circuit for supplying a repetitive gating instant related to a presented synchronizing instant if the presented synchronizing instant occurs between the window start instant and the window end instant comprising a window circuit for generating repetitive window instants comprising a window start instant and a window end instant, and a gate circuit for supplying a repetitive gating instant related to a presented synchronizing instant if the presented synchronizing instant occurs between the window start instant and the window end instant, while the gating instant is related to the window instants if the presented synchronizing instant does not occur between the window start instant and the window end instant, characterized in that the gate circuit comprises means for generating the gating instant related to the window start instant if the presented synchronizing instant occurs before the window start instant, and for generating the gating instant related to the window end instant if the presented synchronizing instant occurs after the end instant, provides a fifth aspect of the invention.

A synchronizing method, comprising the steps of generating repetitive window instants comprising a window start instant and a window end instant, and generating a repetitive gating instant related to a presented synchronizing instant if the presented synchronizing instant occurs between the window start instant and the window end instant, while the gating instant is related to the window instants if the presented synchronizing instant does not occur between the window start instant and the window end instant, characterized in that the gating instant is related to the window start instant if the presented synchronizing instant occurs before the window start instant and for generating the gating instant related to the window end instant if the presented synchronizing instant occurs after the window end instant, provides a sixth aspect of the invention.

These and other aspects of the invention will be apparent from and elucidated with reference to the embodiments described hereinafter.

BRIEF DESCRIPTION OF THE DRAWINGS

In the drawings:

FIGS. 6A–6C show signal diagrams to elucidate the operation of the second embodiment of the window circuit.

FIG. 1A shows a horizontal synchronizing arrangement SC, according to the invention, for use in a television apparatus comprising a display tube CRT. The input signal of the horizontal synchronizing arrangement SC comprises a series of horizontal synchronizing pulses Hs separated from the picture signal PI. The output signal of the circuit of FIG. 1A is a drive signal Hd which controls a horizontal deflection circuit HDEF via a horizontal drive stage HDR and a line output transistor LT. The horizontal deflection circuit HDEF controls the horizontal deflection of the electron beams via horizontal deflection coils HY.

In the following description, a circuit U according to the invention, comprising the window circuits WINC1, WINC2 and the gate circuit GC (see FIG. 1B), will be assumed to be absent. The horizontal synchronizing pulse Hs is connected to an input terminal Ip of a horizontal phase-locked loop circuit HPLL comprising a phase discriminator PD, a first input of which is coupled to the input terminal Ip, and an output of which is connected, via a loop filter LF, to a voltage-controlled oscillator VCO which, in a stable situation, supplies a clock signal CLK having a frequency of N times the repetition frequency of a series of horizontal synchronizing pulses Hs. The phase discriminator PD compares the positions of the horizontal synchronizing pulses Hs with the positions of dividing pulses DP produced by dividing the clock signal CLK by means of a divider circuit DN having the dividend N. An output of the divider circuit DN is connected to an output terminal Up of the horizontal phase-locked loop circuit HPLL and to a second input of the phase discriminator PD. A position difference between the two input signals of the phase discriminator PD will give rise to a variation of the voltage at the output of the loop filter LF with which the voltage-controlled oscillator VCO is controlled, so that this oscillator will adapt the frequency of the clock signal CLK in such a way that said position difference will be eliminated after some time. The positions of the dividing pulses DP will follow the positions of the horizontal synchronizing pulses Hs at a given delay which is fixed by the loop filter LF. The dividing pulses DP, which are available at the output terminal Up of the horizontal phase-locked loop circuit HPLL, are applied to a first input of a second horizontal phase-locked loop circuit SHPLL, a second input of which receives a flyback signal Hf which comprises horizontal flyback information from, for example, a collector of the line output transistor LT or from a secondary winding of a line output transformer LOT. An output of the second horizontal phase-locked loop circuit SHPLL supplies a drive signal Hd and is coupled to a control electrode (base) of the line output transistor LT. This second horizontal phase-locked loop circuit SHPLL compensates for the variation of the switch-off time of the line output transistor LT due to the variation of the collector current through this transistor in dependence upon, for example, the beam current in the display tube CRT. To this end, the positions of the dividing pulses DP are compared with the positions of the pulses in the flyback signal Hf. A difference which is found is corrected as rapidly as possible by a time shift of this edge in the drive signal Hd which determines the switch-off instant of the line output transistor LT.

Figure 1A:
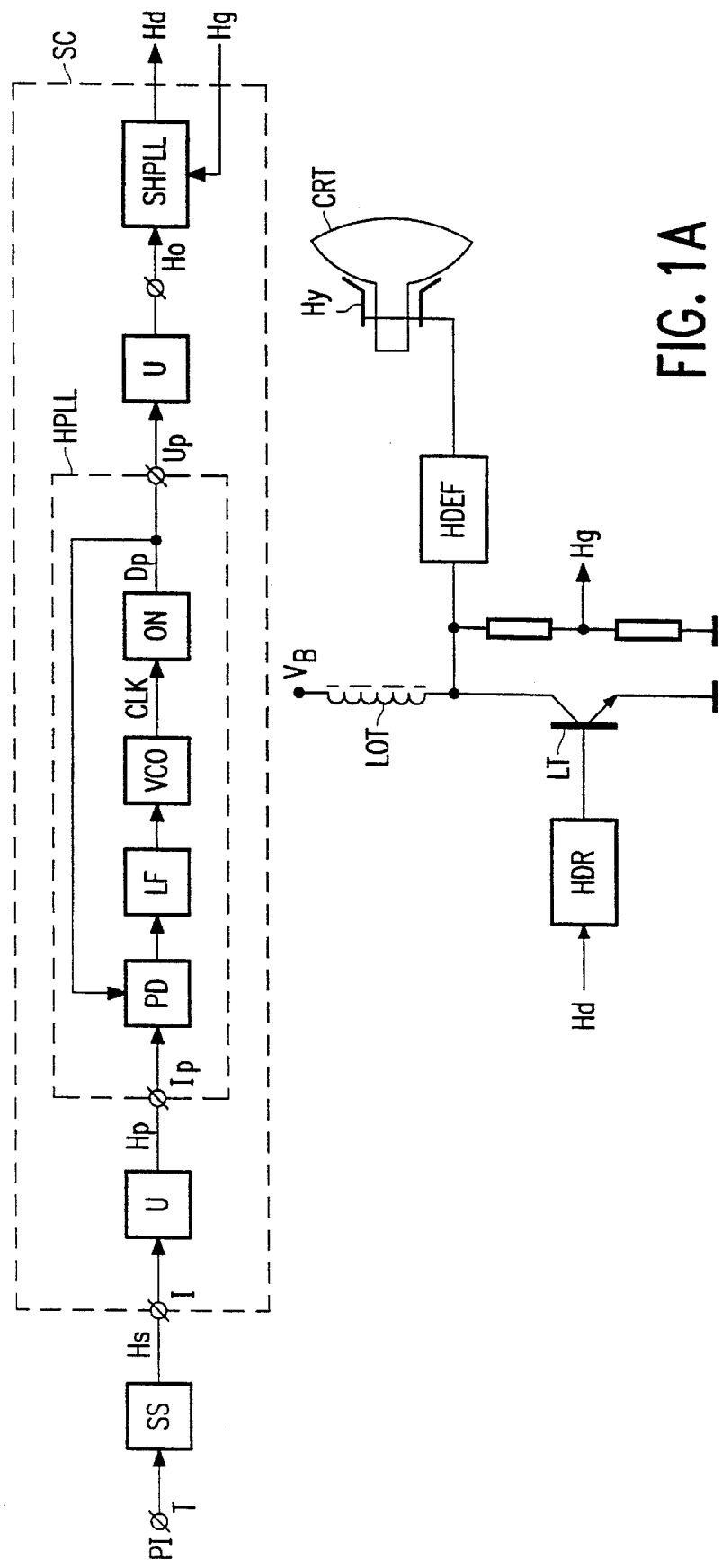
FIGS. 1A and 1B show a synchronizing arrangement according to the invention, used in a picture display device.
Figure 1B:
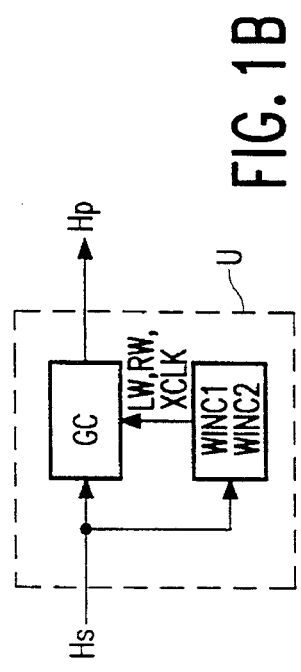

The minimum and the maximum repetition frequency of the pulses in the drive signal Hd can be limited by adding the circuit U according to the invention at one or both positions shown in FIG. 1A: the circuit U, according to the invention, has, as its input signal, the series of horizontal synchronizing pulses Hs separated from the picture signal PI, and, as its output signal, the gating pulses Hp which are applied to the input terminal Ip of the horizontal phase-locked loop circuit HPLL, and/or the circuit U, according to the invention, has, as its input signal the output signals of the divider circuit DN available at the output terminal Up of the horizontal phase-locked loop circuit HPLL, and the gating pulses Hp of the circuit U are applied to one of the inputs of the second horizontal phase-locked loop circuit SHPLL.

Figure 2:
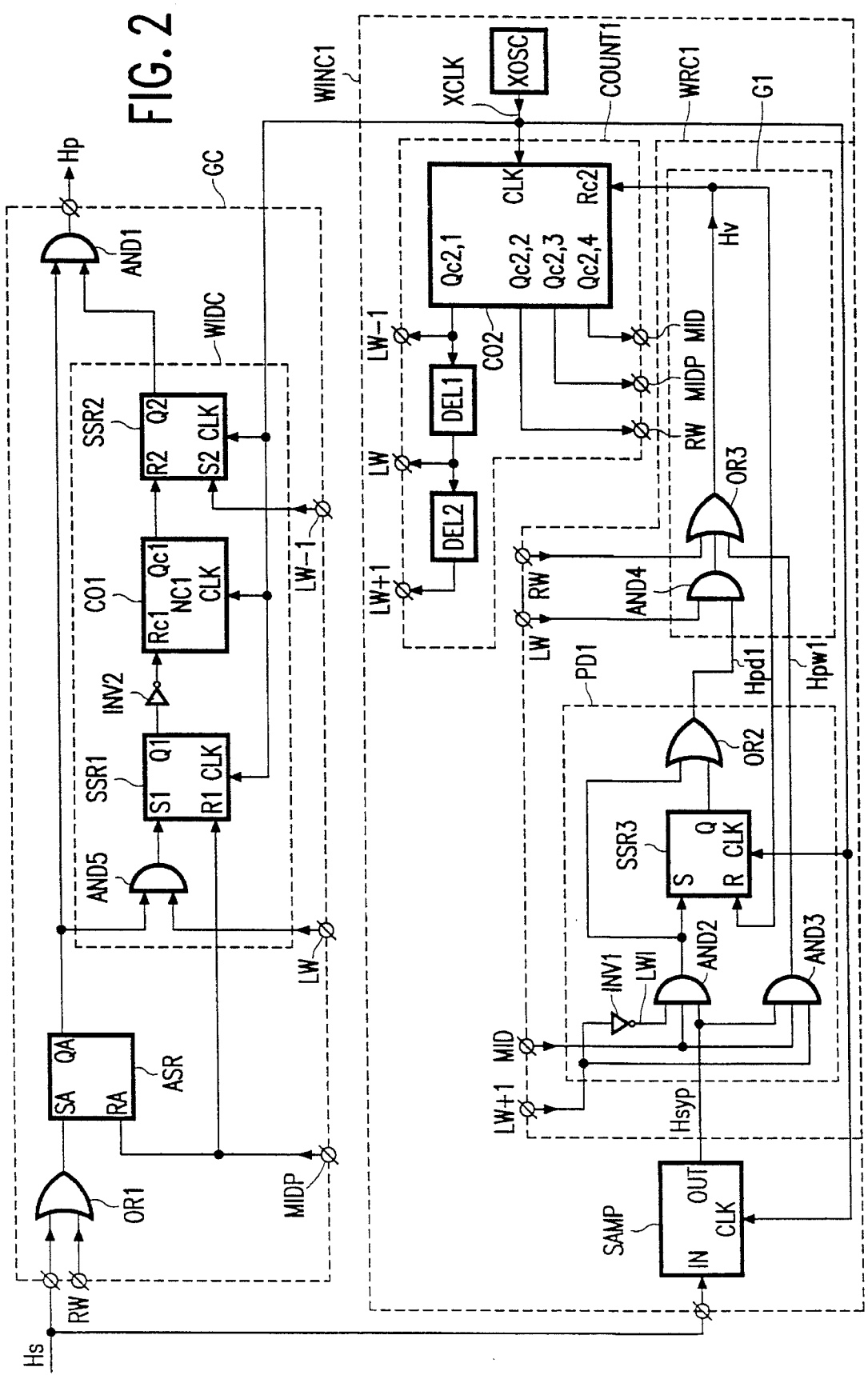
FIG. 2 is a detailed representation of a first embodiment according to the invention.

FIG. 2 diagrammatically shows in detail a first embodiment according to the invention, comprising a gate circuit GC and a first embodiment WINC1 of the window circuit comprising a sampling circuit SAMP, an oscillator circuit XOSC, and a window reference pulse-generating circuit WRC1, comprising a phase discriminator PD1, a gate circuit G1 and a time-pulse generating circuit COUNT1. The window circuit WINC1 will be described first.

The oscillator circuit XOSC is, for example, of the ring oscillator type coupled to a crystal or resonator and supplies a stable clock signal XCLK with which synchronous logics in the gate circuit (GC) and the window circuits (WINC1, WINC2) are clocked. Instead of the clock signal XCLK supplied by this separate oscillator circuit XOSC, the clock signal CLK from the voltage-controlled oscillator VCO may alternatively be used.

The horizontal synchronizing pulses Hs are applied to an input IN of the sampling circuit SAMP, a clock input CLK of which receives the clock signal XCLK. An output OUT of the sampling circuit SAMP supplies the clocked horizontal synchronizing pulses Hsyp. The sampling circuit SAMP ensures that the horizontal synchronizing pulses Hs, occurring asynchronously in time with respect to the clock signal XCLK, are rendered synchronous to the clock signal XCLK, which provides the possibility of further processing by synchronous (clocked) circuits.

The window circuit WINC1 generates, inter alia window-defining time signals, inter alia, a window leading-edge signal LW and a window trailing-edge signal RW. To this end, a counting circuit CO2 counts a given number of clock pulses of the clock signal XCLK from the instant when a window reference signal Hv occurs. The window reference signal Hv, which is also generated by the window circuit WINC1, is related to the clocked horizontal synchronizing pulse Hsyp if it occurs during the window. The window reference signal Hv is related to the window leading-edge signal LW if the clocked horizontal synchronizing pulse Hsyp occurs before the window (hence, before the window leading-edge signal LW is active), and the window reference signal Hv is related to the window trailing-edge signal RW if the clocked horizontal synchronizing pulse Hsyp occurs after the window (hence, after the window trailing-edge signal RW is active). The window circuit WINC1 will now be described in greater detail.

The time-pulse generating circuit COUNT1 comprises the known counting circuit CO2 which consists of a 9-bit restartable counter and logics for decoding counts. The counting circuit CO2 has a clock input CLK connected to the clock signal XCLK and a restart input RC2 to which the window reference signal Hv from the window reference pulse-generating circuit WRC1 is applied. A first output Qc2, 1 of the counting circuit CO2 supplies a first time signal LW−1 (left-edge of window minus one clock period) which becomes active after a given number N1−1 of counted clock periods (for example, 344) after a restart of the counting circuit CO2. The output Qc2, 1 is connected, inter alia to a first clock period delay member DEL1 which supplies the window leading-edge signal LW which becomes active after N1 clock periods after the counter restarts. The first clock period delay member DEL1 is connected, inter alia to a second clock period delay member DEL2 which supplies a second time signal LW+1. A second output Qc2, 2 of the counting circuit CO2 supplies the window trailing-edge signal RW which becomes active after a given number N2 of counted clock periods (for example, 398) after a restart of the counting circuit CO2. A third output Qc2, 3 of the counting circuit CO2 supplies a time pulse MIDP (approximately the middle of a horizontal period) which becomes active during 1 clock period XCLK after a given number N4 of counted clock periods (for example, 192) after a restart of the counting circuit CO2. A fourth output Qc2,4 of the counting circuit CO2 supplies a third time signal MID (approximately the middle of a horizontal period) which becomes active after a given number N3 of counted clock periods (for example, 192) after a restart of the counter. Since the restart input Rc2 of the counting circuit CO2 is activated by means of the window reference signal Hv, a subsequent window (determined by a window leading-edge signal LW and a window trailing-edge signal RW will occur after the end of fixed chosen counts (N1, N2) from the instant when the window reference signal Hv becomes active.

The phase discriminator PD1 comprises a synchronous set-reset flip-flop SSR3 and logics INV1, AND2, AND3, OR2. The clocked horizontal synchronizing pulses Hsyp are applied to an input of a logic AND-gate AND2. Other inputs of the logic AND gate AND2 receive the third time signal MID and an inverted window leading-edge signal LWI, which is generated from the second time signal LW+1 by means of a logic inverter circuit INV1. The output of the logic, AND-gate AND2 is connected to the junction of the set input S of the synchronous set-reset flip-flop SSR3 and an input of a logic OR-gate OR2.

The reset input R of the synchronous set-reset flip-flop SSR3 receives the window reference signal Hv, a clock input CLK receives the clock signal XCLK, and an output Q is connected to the other input of logic OR-gate OR2. An output of the logic OR-gate OR2 supplies a signal Hpd1 which is active when Hsyp occurs after MID but before LW+1 (So, a clocked horizontal synchronizing pulse Hsyp occurs before the start of a window if this horizontal synchronizing pulse Hsyp occurs after the signal MID but before the left edge of the window LW+1) and is deactivated after the occurrence of the window reference signal Hv. The logic AND-gate AND3 has three inputs which receive the clocked horizontal synchronizing pulses Hsyp, the second time signal LW+1 and the third time signal MID, respectively, while the output supplies a signal Hpw1 which is active when Hsyp occurs during the period when the third time signal MID and the second time signal LW+1 are active (hence after the start of the window).

The gate circuit G1 comprises the logic circuits AND4 and OR3. An input of the logic AND-gate AND4 receives signal Hpd1, the other input receives the window leading-edge signal LW, and the output is connected to an input of the logic OR-gate OR3. Other inputs of the logic OR-gate OR3 receive the window trailing-edge signal RW and the signal Hpw1, while the output supplies the window reference signal Hv.

Figure 3C:
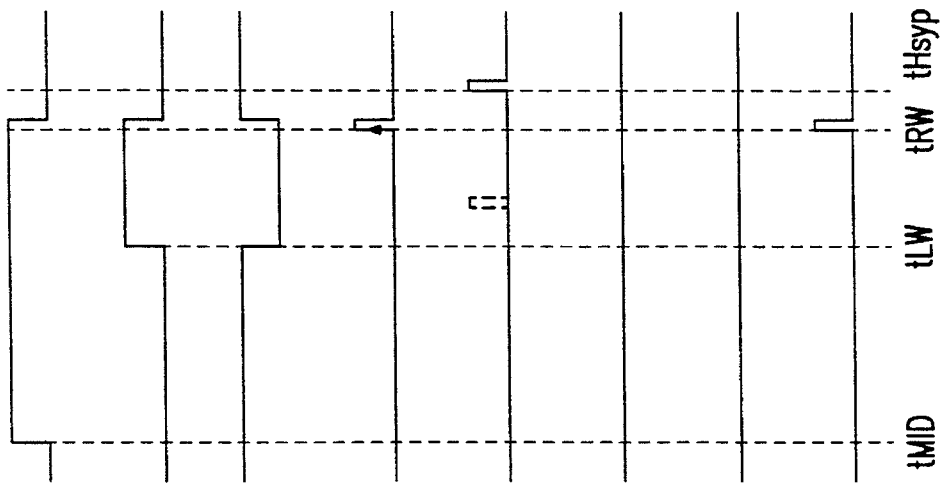
FIGS. 3A–3C show signal diagrams to elucidate the operation of the first embodiment of the window circuit; to elucidate the operation of the gate circuit.
Figure 3B:
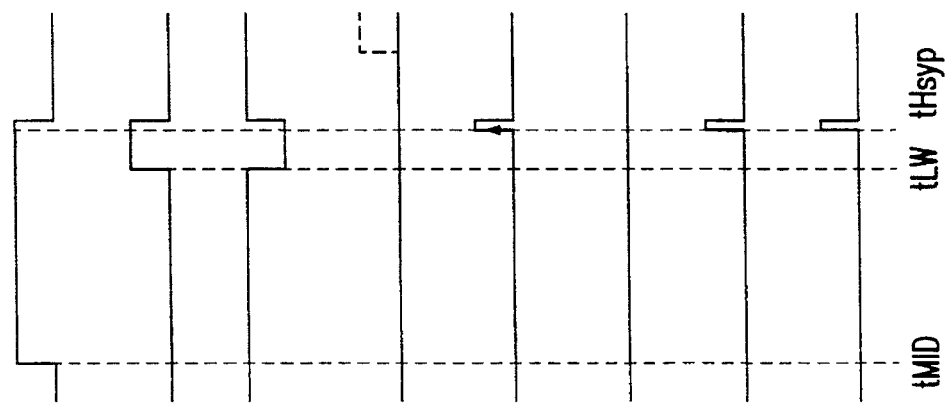
Figure 3A:
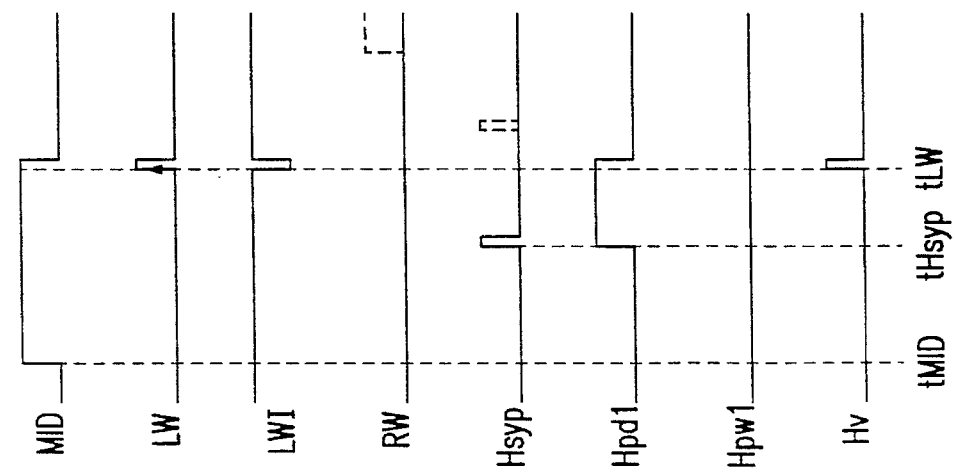

The operation of the window circuit WINC1 will be elucidated with reference to the signal waveforms shown in FIGS. 3A, 3B and 3C, which show the situations when the clocked horizontal synchronizing pulse Hsyp occurs: before the start of the window, during the window and after the end of the window, respectively. For the sake of simplicity, the signals LW−1, LW and LW+1 are supposed to be equal. The nominal positions of the clocked horizontal synchronizing pulse Hsyp and the window trailing-edge signal RW are shown in broken lines.

The logic OR-gate OR3 has three inputs so that the window reference signal Hv becomes active if one of these inputs becomes active. There are three possible situations which are shown in FIGS. 3A, 3B and 3C, respectively.

In the situation shown in FIG. 3A, the third time signal MID becomes active at the instant tMID after the middle of a horizontal period, and the inverted window leading-edge signal LWI is already active, and subsequently, the clocked horizontal synchronizing pulse Hsyp occurs at the instant tHsyp. As a result, all inputs of the logic AND-gate AND2 are active and the signal Hpdl will also be active. At the instant tLW, the output of the logic AND-gate AND4 becomes active when the window leading-edge signal LW becomes active, so that the window reference signal Hv and the restart input Rc2 of the counting circuit CO2 also become active, with which counting circuit, the third time signal MID, the window leading-edge signal LW, the inverted window leading-edge signal LWI, and the window trailing-edge signal RW will be reset to their starting position (similarly as before the instant tMID) one clock period of the clock signal XCLK later. Now, counting of a new set of time signals is started: the next window defined by the window leading-edge signal LW (start of window) and the window trailing-edge signal RW (end of window) is fixedly coupled to the instant when the window reference signal Hv becomes active. The synchronous set-reset flip-flop SSR3 and the logic OR-gate OR2 have for their purpose to detect exclusively the first clocked horizontal synchronizing pulse Hsyp occurring after the signal MID so as to prevent non-defined repetition times of the window reference signal Hv from being produced upon perturbations of the presented horizontal synchronizing pulses Hs. The clocked horizontal synchronizing pulse Hsyp has occurred before the start of the window, with the result that the window reference signal Hv becomes active at the leading edge of the window (defined by the window leading-edge signal LW).

In the situation shown in FIG. 3B, the signal MID becomes active at the instant tMID after the middle of a horizontal period, subsequently the window leading-edge signal LW becomes active at the instant tLW, and then the clocked horizontal synchronizing pulse Hsyp becomes active at the instant tHsyp. As a result, all inputs of the logic AND-gate AND3 are active and also the signal Hpw1, and hence, the window reference signal Hv will be active. The various signals are subsequently reset to their starting position in the same way as described with reference to FIG. 3A. In this situation, the window reference signal Hv becomes active at the instant when the clocked horizontal synchronizing pulse Hsyp occurs within the window.

In the situation shown in FIG. 3C, the signal MID becomes active at the instant tMID after the middle of a horizontal period, and subsequently the window leading-edge signal LW becomes active at the instant tLW. Since the instant tHsyp when the clocked horizontal synchronizing pulse Hsyp occurs is not before the instant tRW when the window trailing-edge signal RW becomes active, the signals Hpdl and Hpwl will not be able to activate the logic OR-gate OR3. It will not be until the instant tRW that the window trailingedge signal RW will activate the logic OR-gate OR3, and hence, the window reference signal Hv. The clocked horizontal synchronizing pulse Hsyp has not occurred before the window trailing-edge signal RW, and thus the window reference signal Hv becomes active at the rear edge of the window (defined by the window trailing-edge signal RW). In other words: if the clocked horizontal synchronizing pulse Hsyp occurs after the window trailing-edge RW, the result will be that the window reference signal Hv becomes active at the window trailing edge RW.

The gate circuit GC shown in FIG. 2 generates the gating signal Hp. The gating signal Hp is related to the presented horizontal synchronizing pulse Hs if the presented horizontal synchronizing pulse Hs occurs during the window, the gating signal Hp is related to the window leading-edge signal LW if the horizontal synchronizing pulse Hs occurs before the window (hence before the window leading-edge signal LW is active), and the gating signal Hp is related to the window trailing-edge signal RW if the horizontal synchronizing pulse Hs occurs after the window (hence, after the window trailing-edge signal RW is active). The gate circuit GC will now be described in detail. The gate circuit GC comprises an asynchronous set-reset flip-flop ASR, a fixed pulse width-generating circuit WIDC and logic gates OR1 and AND1. The asynchronous set-reset flip-flop ASR has a set input SA which is connected to the output of the logic OR-gate OR1, a reset input RA which receives the time pulse MIDP, and an output QA which is connected to inputs of the logic AND-gate AND 1 and a logic AND-gate AND5. The inputs of the logic OR-gate OR1 receive the horizontal synchronizing pulse Hs and the window trailing-edge signal RW. A second input of the logic AND gate AND5 receives the window leading-edge signal LW, and the output is connected to the set input S1 of a first synchronous set-reset flip-flop SSR1. The reset input R1 of the first synchronous set-reset flip-flop SSR1 receives the time pulse MIDP, the clock input CLK is connected to the clock signal XCLK, and the output Q1 is connected, via a logic inverter circuit INV2, to the asynchronous reset input Rc1 of a synchronous resettable counter CO1. A clock input CLK of the counter CO1 receives the clock signal XCLK, and an output Qc1 is connected to the reset input R2 of a second synchronous set-reset flip-flop SSR2. The counter CO1 counts a fixed number of Nc1 clock pulses of the clock signal XCLK. A set input S2 of the second synchronous set-reset flip-flop SSR2 is connected to the first time signal LW−1, a clock input CLK is connected to the clock signal XCLK, and an output Q2 is connected to a second input of the logic AND gate AND 1, the output of which supplies the gating signal Hp. Signals which are also denoted by QA, Q1, Qc1 and Q2 occur at the outputs QA, Q1, Qc1 and Q2, respectively.

The operation of the gate circuit GC will now be explained with reference FIGS. 4A, 4B and 4C, which show the situations in which the horizontal synchronizing pulse Hs occurs before the start of the window, during the window, and after the end of the window, respectively. For the sake of simplicity, time differences in the order of magnitude of a clock period are not taken into account and the signals LW−1 and LW are supposed to be equal. The nominal positions of the horizontal synchronizing pulse Hs and the window trailing-edge signal RW are shown in broken lines.

In each of the three Figures, the signal MIDP becomes active during a clock period at the instant tMID approximately in the middle of a horizontal period, whereafter the signals QA, Q1 and Qc1 are in their inactive state. During the first occurrence of the two instants tHs (the horizontal synchronizing pulse Hs becomes active) or tRW (the window trailing-edge signal RW becomes active), the asynchronous set-reset flip-flop ASR is set, via the logic OR-gate OR1 directly, (i.e., without waiting for the next clock pulse XCLK), with which the signal QA becomes active. The combination of the logic OR-gate OR1 and the asynchronous set-reset flip-flop ASR supplies the signal QA which becomes active at the instant when the presented horizontal synchronizing pulse Hs becomes active if this pulse occurs before the window trailing-edge signal RW, or the signal QA which becomes active at the instant when the window trailing-edge signal RW becomes active if the horizontal synchronizing pulse does not occur before the window trailing-edge signal.

The operation of the fixed pulse width-generating circuit WIDC will now be explained. A first input of the logic AND-gate AND5 is connected to the window leading-edge signal LW and a second input is connected to the signal QA, and at the instant when both signals LW, QA are active, the output becomes active and the first synchronous set-reset flip-flop SSR1 will be set. The activation of the signal Q1 eliminates the reset state of the counter CO1, whereafter, this counter supplies a signal QC1 which becomes active after a fixed number (NC1) of clock pulses of the clock signal XLCK has been counted, hence after a fixed time TC1, with the result that the second synchronous set-reset flip-flop SSR2, which was set at the instant tLW, is reset by means of the window leading-edge signal LW: Q2 becomes inactive. The signal Q2 will thus become active at the instant tLW and inactive after a period of time TC1 from the instant when the two signals LW, QA at the inputs of the logic AND-gate AND5 are active.

Figure 4A:
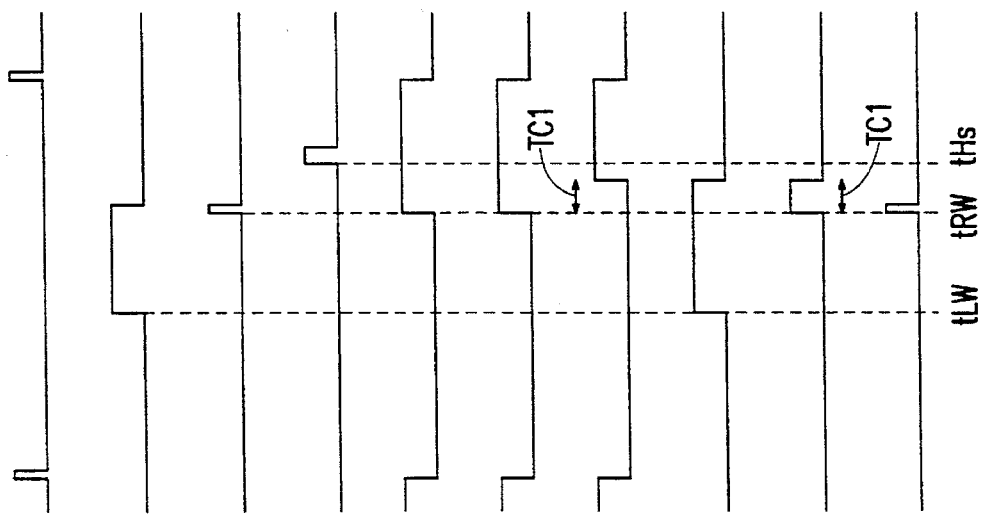

In the situation shown in FIG. 4A, the horizontal synchronizing pulse Hs and hence the signal QA become active at the instant tHs, which is before the instant tLW when the window leading-edge signal LW becomes active. At the instant tLW, not only the signal QA, which is already active, but also the window leading-edge signal LW will become active at the inputs of the logic AND-gate AND5 and, in accordance with the foregoing, a signal Q2 will be generated which will become active at the instant tLW and inactive after a period of time TC1 from the instant tLW. A logic AND function (AND1) of the signals Q2 and QA yields the signal Q2 as the gating signal Hp. The horizontal synchronizing pulse Hs has occurred before the start of the window, with the result that the gating signal Hv becomes active at the leading edge of the window (defined by the window leading-edge signal LW) and has a fixed period of time TC1.

Figure 4B:
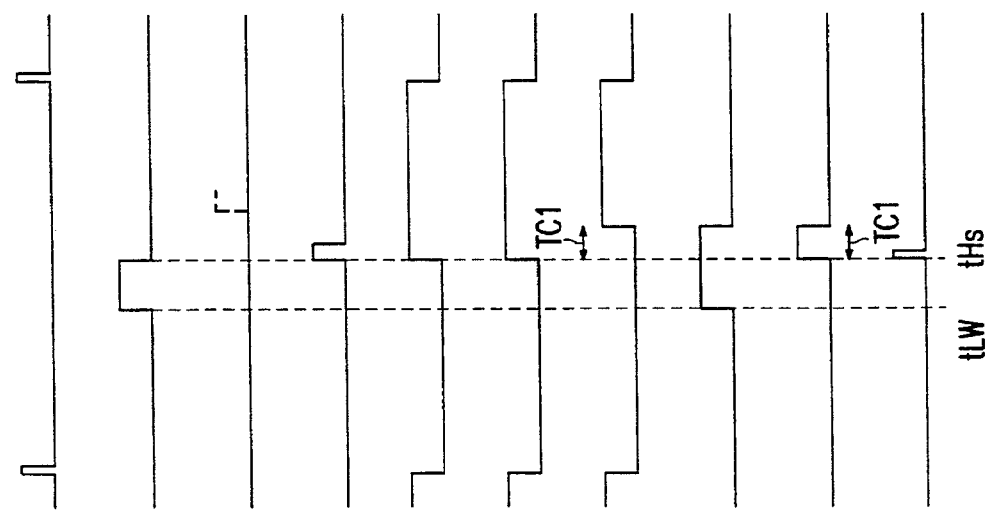

In the situation shown in FIG. 4B, the horizontal synchronizing pulse Hs, and hence the signal QA become active at the instant tHs which is now after the instant tLW when the window leading-edge signal LW becomes active. This renders the second input signal of the logic AND-gate AND5 active, with which, in accordance with the foregoing, a signal Q2 is generated which will become active at the instant tLW and inactive after a period of time TC1 from the instant tHs. A logic AND function (AND1) of the signals Q2 and QA yields the gating signal Hp which becomes active at the instant tHs and subsequently becomes inactive a period of time TC1 later. The horizontal synchronizing pulse Hs has occurred during the window, with the result that the gating signal Hp becomes active at the instant when the horizontal synchronizing pulse Hs becomes active and has a fixed period of time TC1.

Figure 4C:
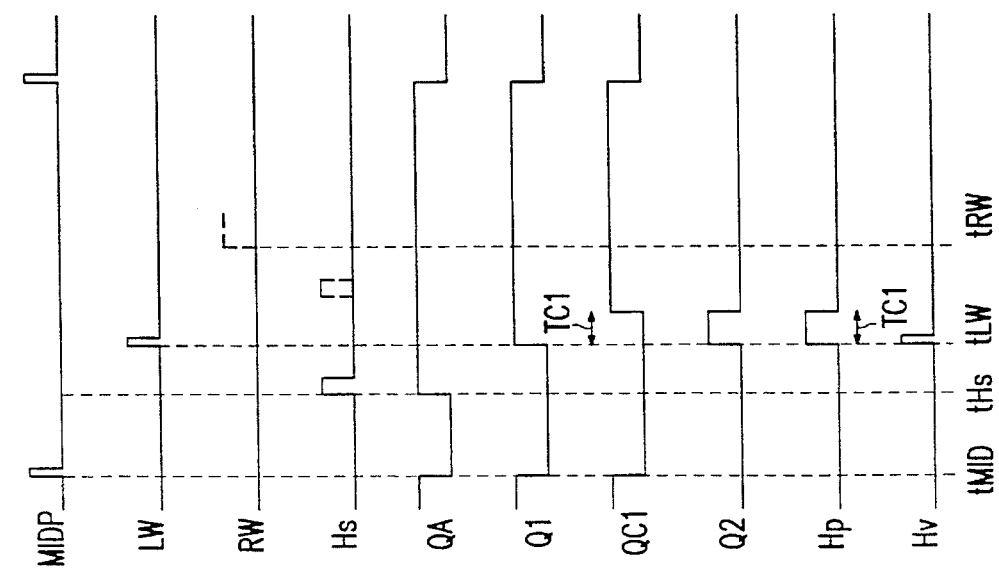

In the situation shown in FIG. 4C, the instant tHs is now after the instant tRW when the window trailing-edge signal RW becomes active. In accordance with the foregoing, the output signal QA will then become active at the instant tRW. At this instant tRW, the second input signal of the logic AND-gate AND5 will become active in addition to the first input signal (LW), which is already active, which also renders the output signal QA active and, in accordance with the foregoing, an output signal Q2 is generated which becomes active at the instant tLW and inactive after a period of time TC1 from the instant tRW. A logic AND function (AND 1) of the signals Q2 and QA yields a gating signal Hp which becomes active at the instant tRW and becomes inactive a period of time TC1 later. The horizontal synchronizing pulse Hs has not occurred before the window trailing-edge signal RW, which renders the gating output signal Hp active at the trailing edge of the window (defined by the window trailing-edge signal RW) and has a fixed period of time TC1.

Figure 5:
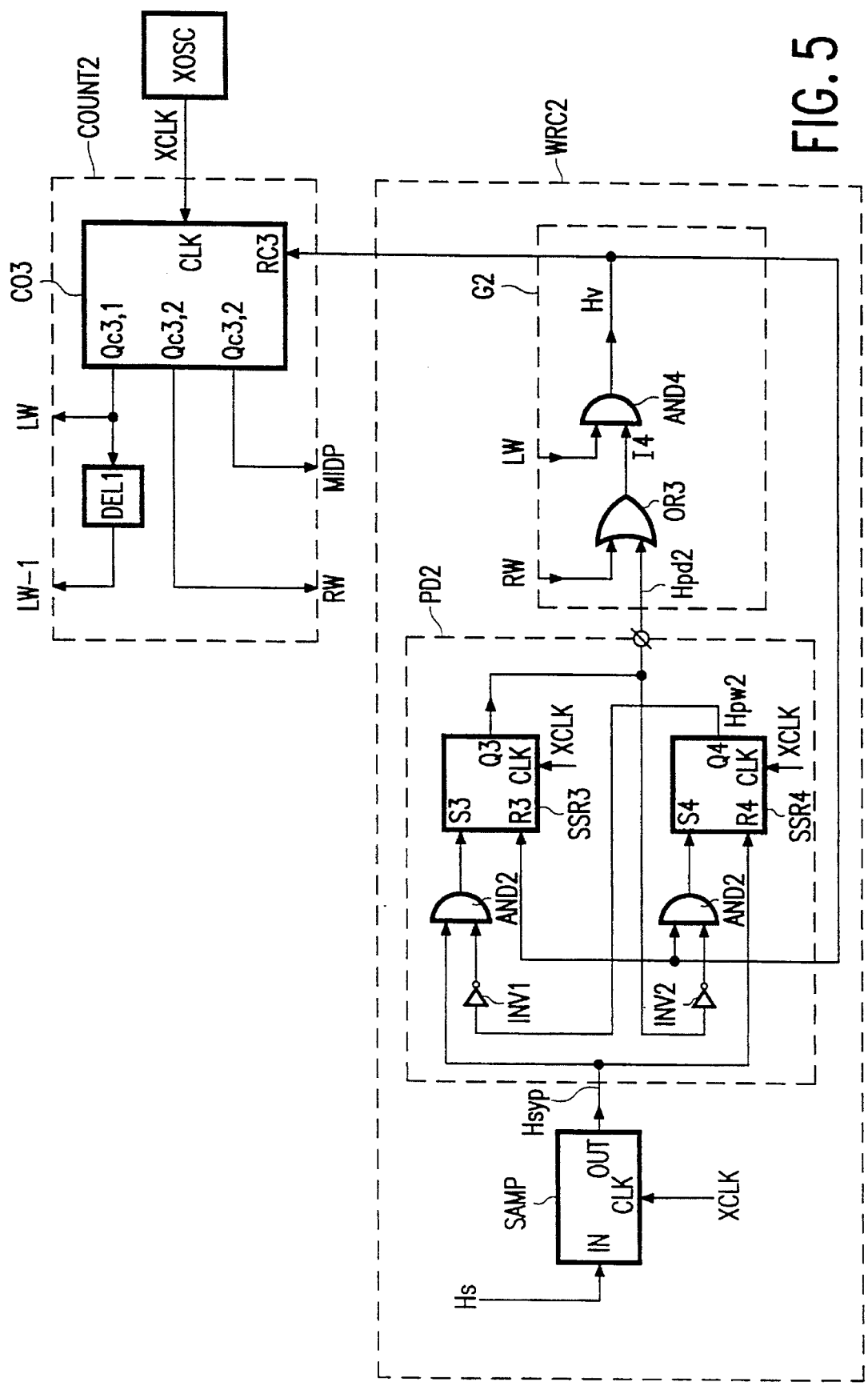
FIG. 5 is a detailed representation of a second embodiment of the window circuit according to the invention.

FIG. 5 is a detailed representation of a second embodiment WINC2 of the window circuit according to the invention, comprising a sampling circuit SAMP, an oscillator circuit XOSC and a window reference pulse-generating circuit WRC2 comprising a phase discriminator PD2, a gate circuit G2, and a divider circuit COUNT2.

The oscillator circuit XOSC and the sampling circuit SAMP have been described hereinbefore.

The window circuit WINC2 generates, inter alia window-defining time signals, such as the window leading-edge signal LW and the window trailing-edge signal RW. To this end a counting circuit CO3 counts a given number of clock pulses of the clock signal XCLK from the instant when the window reference signal Hv occurs. The window reference signal Hv is generated by the window circuit WINC2 by means of the phase discriminator PD2 and the gate circuit G2 at such an instant that the resultant time interval, with respect to a previous window reference signal Hv−1 is as close as possible to the period of time between two consecutive clocked synchronizing pulses Hsyp−1 and Hsyp preceding the window reference signal Hv, said instant being always within a time interval which is defined by the window leading-edge signal LW and the window trailing-edge signal RW. The window circuit WINC2 will now be described in detail.

The time pulse-generating circuit COUNT2 comprises the counting circuit CO3 which is composed of a 9-bit restartable counter and logics for decoding counts. The counting circuit CO3 has a clock input CLK for the clock signal XCLK and a restart input RC3 for receiving the window reference signal Hv from the window reference pulse-generating circuit WRC2. A first output Qc3, 1 of the counting circuit CO3 supplies a first time signal LW−1 (left-edge of window minus one clock period) which becomes active after a given number of N1-1 counted clock periods (for example, 344) after a restart of the counter. The output Qc3, 1 is connected, inter alia to a clock period delay member DEL1 which supplies a window leading-edge signal LW which becomes active after N1 clock periods after the restart of the counter. A second output Qc3,2 of the counting circuit CO3 supplies a window trailing-edge signal RW which becomes active after a given number of N2 counted clock periods (for example, 398) after a restart of the counter. A third output Qc3,3 of the counting circuit CO2 supplies a time pulse MIDP (approximately the middle of a horizontal period) which becomes active during 1 clock period XCLK after a given number of N4 counted clock periods (for example, 192) after a restart of the counter. Since the restart input RC3 of the counting circuit CO3 is activated by means of the window reference signal Hv, a subsequent window (defined by the window leading-edge signal LW and the window trailing-edge signal RW) will occur after the end of fixed chosen counts (N1 and N2).

The horizontal synchronizing pulse Hs is applied to an input of the sampling circuit SAMP, another input of which receives the clock signal XCLK. The output OUT of the sampling circuit SAMP supplies the clocked horizontal synchronizing pulses Hsyp.

The phase discriminator PD2 comprises a first and a second synchronous set-reset flip-flop SSR3 and SSR4, respectively, of a type in which the reset has priority over the set, and logics INV1, INV2, AND2, AND3. The clocked horizontal synchronizing pulses Hsyp are applied to a first input of the logic AND-gate AND2 and to a reset input R4 of the second synchronous set-reset flip-flop SSR4. A second input of the logic AND-gate AND2 is connected via a logic inverter gate INV1 to an output Q4 of a second synchronous set-reset flip-flop SSR4, and the output is connected to the set input S3 of the first synchronous set reset flip-flop SSR3. A reset input R3 of the first synchronous set-reset flip-flop SSR3 receives the window reference signal Hv, the clock input CLK receives the clock signal XCLK, and the output Q3 supplies a signal Hpd2 and is connected, inter alia to a first input of a logic AND-gate AND3 via a logic inverter gate INV2. A second input of the logic AND gate AND3 receives the window reference signal Hv, and an output is connected to a set input S4 of the second synchronous set-reset flip-flop SSR4. A clock input CLK of the second synchronous set-reset flip-flop SSR4 receives the clock signal XCLK and an output Q4 supplies a signal Hpw2.

The gate circuit G2 comprises the logic circuits AND4 and OR3. A first input of the logic OR-gate OR3 receives the signal Hpd2, a second input receives the window trailing-edge signal RW and an output is connected to a first input of the logic AND-gate AND4. A second input of the logic AND-gate AND4 receives the window leading-edge signal LW and an output supplies the window reference signal Hv.

The operation of the window circuit WINC2 will be further elucidated with reference to the signal waveforms shown in FIGS. 6A, 6B and 6C, which show the situations where the time between consecutive clocked horizontal synchronizing pulses Hsyp has a nominal value so that the clocked horizontal synchronizing pulses Hsyp always occur at the same position within the window, the situation of a too short period, and the situation of a too long period, respectively. The nominal positions of the window trailing-edge signal RW are shown in broken lines.

The operation of the time pulse-generating circuit COUNT2 need not be elucidated, but for the fact that the time pulse-generating circuit COUNT2 is equal to the time pulse-generating circuit COUNT1 because the second time signal LW+1 and the third time signal MID need not be generated any longer.

In the starting situation of the phase discriminator PD2, the output signals Hpd2 and Hpw2 of the first and the second synchronous set-reset flip-flop SSR3 and SSR4 are not active, so that every time one of the inputs of the logic AND gates AND2 and AND3 is active via the logic inverter gates INV1 and INV2. There are now two subsequent situations, which depend on which of the input signals of the phase discriminator PD2, the clocked synchronizing pulse Hsyp and the window reference signal Hv is the first to become active. The first situation will now be described. If the clocked synchronizing pulse Hsyp is the first to become active (as a result of the occurrence of a horizontal synchronizing pulse Hs), the set input S3 of the first synchronous set-reset flip-flop SSR3 will become active via the logic AND gate AND2, and the output signal Hpd2 will become active upon a subsequent clock period CP of the clock signal XCLK. Also, the reset input R4 of the second synchronous set-reset flip-flop SSR4 will become active, with the output signal Hpw2 then remaining inactive during the subsequent clock period CP.

In the situation shown in FIG. 6A, the window leading-edge signal LW becomes active at the instant tLW1. with the second input of the logic AND gate AND4 becoming active. At the instant tHsyp1 the clocked horizontal synchronizing pulse Hsyp becomes active, while in accordance with the foregoing, the signal Hpd2 becomes active one clock period CP later and the signal Hpw2 remains inactive. The signal Hpd2 will render the first input of the logic AND-gate AND4 active via the logic OR-gate OR3, and hence the window reference signal Hv and the reset input R3 of the first synchronous set-reset flip-flop SSR3, so that one clock period later, the signal Hpd2 and hence the window reference signal Hv become inactive. Since the signal Hpd2 is also active during the active state of the window reference signal Hv, the logic AND-gate AND3 will remain inactive via the logic inverter gate INV2, and hence the signal Hpw2 will remain inactive. As a result of the fact that the window reference signal Hv becomes active, the counting circuit CO3 is reset after a further clock period CP at the instant t0 and the window leading-edge signal LW becomes inactive. The counting circuit CO3 starts from this instant until a reset is activated by the fact that a subsequent window reference pulse Hv becomes active. The instant t0 is hereinafter referred to as the starting instant. The next window leading-edge signal LW becomes active at the instant tLW2 after a time Tmin which is equal to N1 times the clock period of XCLK from the starting instant t0, while the window trailing-edge signal RW would have become active after a time Tmax equal to N2 times the clock period of XCLK from the starting instant t0 if a clocked horizontal synchronizing pulse Hsyp had not become active before this instant. The second clocked horizontal synchronizing pulse Hsyp, which occurs in the window at the instant tHsyp2, is processed in the same way as described hereinbefore for the instant tHsyp1. The clocked synchronizing pulses Hsyp presented with a period between Tmin and Tmax and falling within the window are passed on as a window reference pulse Hv (with a delay of one clock period CP).

In the situation shown in FIG. 6B, the clocked synchronizing signal Hsyp becomes active after the starting instant t0 at the instant tHsyp2 and before the window leading-edge signal LW becomes active. As described hereinbefore, the output signal Hpd2 becomes active at the next clock period and the output signal Hpw2 remains inactive. The signal Hpd2 will render the first input of the logic AND-gate AND4 active via the logic OR-gate OR3. At the instant tLW2, the window leading-edge signal LW becomes active and hence the second input of the logic AND-gate AND4 and consequently, also the window reference signal Hv and hence the reset input R3 of the first synchronous set-reset flip-flop SSR3 so that one clock period CP later, the signal Hpd2 and hence the window reference signal Hv become inactive. Since the signal Hpd2 is also active during the period when the window reference signal Hv is active the logic AND-gate AND3 will remain inactive via the logic inverter gate INV2 and hence the signal Hpw2 will remain inactive. If the period of two consecutive clocked synchronizing pulses Hsyp is shorter than Tmin, the window reference signal Hv will become equal to the window leading-edge signal LW. This embodiment detects whether a clocked synchronizing pulse Hsyp occurs in a time interval between a reference signal Hv occurring on instant to and a succeeding window leading-edge signal LW occurring on instant tLW2. If the reference signal Hv occurs withing the above defined time interval, it is defined to occur before the window. This in contrary to the embodiment described in FIG. 2, wherein before, the window is defined as occurring in a time interval between the signal MID and the succeeding window leading-edge signal LW. The signal MID starts at about half a line period after a preceding reference signal Hv.

In the situation shown in FIG. 6C, the window leading-edge signal LW and hence the second input of the logic AND-gate AND4 become active at the instant tLW2 after the starting instant t0. At the instant tRW2 the window trailing-edge signal RW at the second input of the logic OR-gate OR3 becomes active and also the first input of the logic AND-gate AND4 and hence the window reference signal Hv will become active. The set input S4 of the second synchronous set-reset flip-flop SSR4 becomes active via the logic AND gate AND3 and the output signal Hpw2 will then become active during the next clock period XCLK. Also, the reset input R3 of the first synchronous set-reset flipflop SSR3 becomes active, with the output signal Hpd2 remaining inactive during the next clock period XCLK. As a result of the fact that the window reference signal Hv becomes active, the counting circuit CO3 is reset and the window leading-edge signal LW and the window trailing-edge signal RW become inactive at a starting instant t0' after a clock period CP. At the instant tHsyp2, a clocked horizontal synchronizing pulse Hsyp occurs, which renders the reset input R4 of the second synchronous set-reset flip-flop SSR4 active, while the signal Hpw2 becomes inactive one clock period later. Since the logic AND-gate AND2 at an input is inactive due to the active signal Hpw2 via a logic inverter gate, the state of the first synchronous set-reset flipflop SSR3 does not change: the output signal Hpd2 remains inactive. Now, the first and second synchronous set-reset flip-flops SSR3 and SSR4 are in the same state as at the instant t0 and, dependent on the instant when a subsequent clocked horizontal synchronizing pulse Hsyp occurs, one of the situations described hereinbefore may occur. If the period of two consecutive clocked synchronizing pulses Hsyp is longer than Tmax, the window reference signal Hv will become equal to the window trailing-edge signal RW (at the instant tRW2).

It is to be noted that it is also possible to use the asynchronous gating signal Hp or a gating signal Hp which has been rendered synchronous as a reset signal for the counting circuit CO2, CO3, instead of the synchronously generated window reference pulse Hv which is actually a synchronous replica of the asynchronous gating signal Hp.

Further, analog embodiments instead of digital embodiments as described above are alternatively possible. Triggerable sawtooth generators may be used instead of the digital counters CO2, CO3. The counters CO2, CO3 raise the count from a reset command (for example, Hv) as a function of time, which count is a measure of the elapsed time. A customary triggerable sawtooth generator accumulates a current in a capacitor and generates a voltage which is a measure of the time which has elapsed from the trigger pulse. Voltage level comparators may be used as analog equivalents for reading counts and generating associated edges or pulses.

The functions performed by the digital embodiments as described above can alternatively be realized with a microcomputer. The microcomputer may calculate instants that represent the pulses being mentioned in this application.

As an example, the window pulses LW, RW may be represented by an instant of occurrence of the leading edge LW of the window, and by an instant of occurrence of the trailing edge RW of the window, respectively. These instants may by represented by computing values, The microcomputer also may produce the pulses.

It should be noted that the above-mentioned embodiments illustrate rather than limit the invention, and that those skilled in the art will be able to design many other alternative embodiments without departing from the scope of the appended claims. In the claims, any reference signs placed between parentheses shall not be construed as limiting the claim.

What is claimed is:

1. A synchronizing arrangement comprising:
   a window circuit for generating a repetitive window signal; and
   a gate circuit for supplying a repetitive gating pulse related to a presented synchronizing pulse if the presented synchronizing pulse occurs during the window signal, while the gating pulse is related to the window signal if the presented synchronizing pulse does not occur during the window signal, characterized in that the gate circuit comprises means for generating the gating pulse related to a leading edge of the window signal if the presented synchronizing pulse occurs before the start of the window signal, and for generating the gating pulse related to a trailing edge of the window signal if the presented synchronizing pulse occurs after the end of the window signal.

2. A synchronizing arrangement as claimed in claim 1, characterized in that the window circuit comprises means for generating a reference pulse related to the presented synchronizing pulse if a pulse related to the presented synchronizing pulse occurs during the window signal, and for generating said reference pulse related to the leading edge or the trailing edge of the window signal if the presented synchronizing pulse does not occur during the window signal, said reference pulse providing a time reference for determining the subsequent window signal.

3. A synchronizing arrangement as claimed in claim 2, characterized in that the window circuit comprises means for generating the reference pulse related to the leading edge of the window signal if the pulse related to the presented synchronizing pulse occurs before the start of the window signal, and for generating the reference pulse related to the trailing edge of the window signal if the pulse related to the presented synchronizing pulse occurs after the end of the window signal.

4. A synchronizing arrangement as claimed in claim 2, characterized in that the window circuit comprises means for generating the reference pulse at such an instant that the length of the time interval formed together with a preceding reference pulse is as close as possible to the period of time between two consecutive pulses being related to the presented synchronizing pulse and which consecutive pulses correspond with the reference pulses, said instant being always within a window defined by the leading edge of the window signal and the trailing edge of the window signal.

5. A synchronizing arrangement as claimed in claim 1, characterized in that the window circuit comprises edge-generating means for generating the leading edge and the trailing edge of the window signal in relation to the previous output pulse of the gate circuit.

6. A synchronizing arrangement as claimed in claim 2, characterized in that the window circuit comprises edge-generating means for generating the leading edge and the trailing edge of the window signal in relation to the reference pulse.

7. A synchronizing arrangement as claimed in claim 5, characterized in that the window circuit and the gate circuit are coupled to receive the presented synchronizing pulse and to apply the gating pulse to a phase-locked loop circuit, or an input terminal of the window circuit and the gate circuit is coupled to an output terminal of the phase-locked loop circuit, and in that an input terminal of the phase-locked loop circuit is coupled to receive the presented synchronizing pulse, the synchronizing arrangement further comprising means for generating a clock signal related to an oscillator of the phase-locked loop circuit, the edge-generating means being adapted to count a given number of pulses from the oscillator of the phase-locked loop circuit so as to determine the period of time from the current gating pulse to the leading edge and the trailing edge of a future window signal.

8. A synchronizing arrangement as claimed in claim 6, characterized in that the window circuit and the gate circuit are coupled to receive the presented synchronizing pulse and to apply the gating pulse to a phase-locked loop circuit, or an input terminal of the window circuit and the gate circuit is coupled to an output terminal of the phase-locked loop circuit, and in that an input terminal of the phase-locked loop circuit is coupled to receive the presented synchronizing pulse, the synchronizing arrangement further comprising means for generating a clock signal related to and oscillator of the phase-locked loop circuit, the edge-generating means being adapted to count a given number of pulses from the oscillator of the phase-locked loop circuit so as to determine the period of time from the current reference pulse to the leading edge and the trailing edge of a future window signal.

9. A synchronizing arrangement as claimed in claim 5, characterized in that the window circuit further comprises a separate oscillator for generating a clock signal, the edge-generating means being adapted to count a given number of pulses from the separate oscillator so as to determine the period of time from the current gating pulse to the leading edge and the trailing edge of a future window signal.

10. A synchronizing arrangement as claimed in claim 6, characterized in that the window circuit further comprises a separate oscillator for generating a clock signal, the edge-generating means being adapted to count a given number of pulses from the separate oscillator so as to determine the period of time from the current reference pulse to the leading edge and the trailing edge of a future window signal.

11. A synchronizing arrangement as claimed in claim 1, characterized in that the gate circuit comprises means for giving the gating pulse a desired width.

12. A method of generating synchronizing pulses, comprising the steps of:

generating a repetitive window signal; and generating a repetitive gating pulse related to a presented synchronizing pulse if the presented synchronizing pulse occurs during the window signal, while the gating pulse is related to the window signal if the presented synchronizing pulse does not occur during the window signal, characterized in that the gating pulse is related to a leading edge of the window signal if the presented synchronizing pulse occurs before the start of the window signal, and for generating the gating pulse related to a trailing edge of the window signal if the presented synchronizing pulse occurs after the end of the window signal.

13. A method of generating synchronizing pulses as claimed in claim 12, characterized in that a reference pulse related to the presented synchronizing pulse is generated if the presented synchronizing pulse occurs during the window signal, and in that said reference pulse related to the leading edge or the trailing edge of the window signal is generated if the presented synchronizing pulse does not occur during the window signal.

14. A picture display device comprising an input terminal for receiving picture information, means for separating the horizontal synchronizing pulses, a synchronizing arrangement for controlling a horizontal addressing of the picture display device, and a display screen, the synchronizing arrangement comprising:

a window circuit for generating a repetitive window signal; and a gate circuit for supplying a repetitive gating pulse related to a presented synchronizing pulse if the presented synchronizing pulse occurs during the window signal, while the gating pulse is related to the window signal if the presented synchronizing pulse does not occur during the window signal, characterized in that the gate circuit comprises means for generating the gating pulse related to a leading edge of the window signal if the presented synchronizing pulse occurs before the start of the window signal, and for generating the gating pulse related to a trailing edge of the window signal if the presented synchronizing pulse (Hs) occurs after the end of the window signal.

15. A picture display device adapted to receive picture information at an input terminal for separating the horizontal synchronizing pulses, for controlling a horizontal addressing and for displaying the picture information on a display screen, the control of the horizontal addressing comprising the steps of:

generating a repetitive window signal; and generating a repetitive gating pulse related to a presented synchronizing pulse if the presented synchronizing pulse occurs during the window signal, while the gating pulse is related to the window signal if the presented synchronizing pulse does not occur during the window signal, characterized in that the gating pulse is related to a leading edge of the window signal if the presented synchronizing pulse occurs before the start of the window signal, and in that the gating pulse is related to a trailing edge of the window signal if the presented synchronizing pulse occurs after the end of the window signal.

16. A synchronizing arrangement comprising:

a window circuit for generating repetitive window instants comprising a window start instant and a window end instant, and a gate circuit for supplying a repetitive gating instant related to a presented synchronizing instant if the presented synchronizing instant occurs between the window start instant and the window end instant, while the gating instant is related to the window instants if the presented synchronizing instant does not occur between the window start instant and the window end instant, characterized in that the gate circuit comprises means for generating the gating instant related to the window start instant if the presented synchronizing instant occurs before the window start instant, and for generating the gating instant related to the window end instant if the presented synchronizing instant occurs after the end instant.

17. A method of generating synchronizing instants, comprising the steps of:

generating repetitive window instants comprising a window start instant and a window end instant, and generating a repetitive gating instant related to a presented synchronizing instant if the presented synchronizing instant occurs between the window start instant and the window end instant, while the gating instant is related to the window instants if the presented synchronizing instant does not occur between the window start instant and the window end instant, characterized in that the gating instant is related to the window start instant if the presented synchronizing instant occurs before the window start instant and for generating the gating instant related to the window end instant if the presented synchronizing instant occurs after the window end instant.

18. A synchronizing arrangement as claimed in claim 3, characterized in that the window circuit comprises edge-generating means for generating the leading edge and the trailing edge of the window signal in relation to the reference pulse.

19. A synchronizing arrangement as claimed in claim 18, characterized in that the window circuit and the gate circuit are coupled to receiver the presented synchronizing pulse and to apply the gating pulse to a phase-locked loop circuit, or an input terminal of the window circuit and the gate circuit is coupled to an output terminal of the phase-locked loop circuit, and in that an input terminal of the phase-locked loop circuit is coupled to receive the presented synchronizing pulse, the synchronizing arrangement further comprising means for generating a clock signal related to an oscillator of the phase-locked loop circuit, the edge-generating means being adapted to count a given number of pulses from the oscillator of the phase-locked loop circuit so as to determine the period of time from the current reference pulse to the leading edge and the trailing edge of a future window signal.

20. A synchronizing arrangement as claimed in claim 18, characterized in that the window circuit further comprises a separate oscillator for generating a clock signal, the edge-generating means being adapted to count a given number of pulses from the separate oscillator so as to determine the period of time from the current reference pulse to the leading edge and the trailing edge of a future window signal.

21. A synchronizing arrangement as claimed in claim 4, characterized in that the window circuit comprises edge-generating means for generating the leading edge and the trailing edge of the window signal in relation to the reference pulse.

22. A synchronizing arrangement as claimed in claim 21, characterized in that the window circuit and the gate circuit are coupled to receiver the presented synchronizing pulse and to apply the gating pulse to a phase-locked loop circuit, or an input terminal of the window circuit and the gate circuit is coupled to an output terminal of the phase-locked loop circuit, and in that an input terminal of the phase-locked loop circuit is coupled to receive the presented synchronizing pulse, the synchronizing arrangement further comprising means for generating a clock signal related to an oscillator of the phase-locked loop circuit, the edge-generating means being adapted to count a given number of pulses from the oscillator of the phase-locked loop circuit so as to determine the period of time from the current reference pulse to the leading edge and the trailing edge of a future window signal.

23. A synchronizing arrangement as claimed in claim 21, characterized in that the window circuit further comprises a separate oscillator for generating a clock signal, the edge-generating means being adapted to count a given number of pulses from the separate oscillator so as to determine the period of time from the current reference pulse to the leading edge and the trailing edge of a future window signal.

* * * * *